United States Patent [19]
Green et al.

[11] Patent Number: 5,907,299
[45] Date of Patent: May 25, 1999

[54] ANALOG-TO DIGITAL CONVERTER WITH DELTA-SIGMA MODULATOR

[75] Inventors: Robert S. Green, Sandy; Keith L. Davis, Salt Lake City, both of Utah

[73] Assignee: Sonix Technologies, Inc., Salt Lake City, Utah

[21] Appl. No.: 08/731,963

[22] Filed: Oct. 23, 1996

[51] Int. Cl.$^6$ .................................................. H03M 1/00
[52] U.S. Cl. ........................................... 341/143; 341/155
[58] Field of Search ................................. 341/118, 120, 341/155, 143

[56] References Cited

U.S. PATENT DOCUMENTS

| | | | |
|---|---|---|---|
| 3,585,634 | 6/1971 | Sharples | 341/172 |
| 3,747,089 | 7/1973 | Sharples | 341/167 |
| 4,739,305 | 4/1988 | Naito | 341/118 |
| 4,992,748 | 2/1991 | Gard | 329/321 |
| 5,633,989 | 5/1997 | Shin et al. | 395/24 |

*Primary Examiner*—Brian Young
*Assistant Examiner*—Peguy JeanPierre
*Attorney, Agent, or Firm*—D'Alessandro & Ritchie

[57] ABSTRACT

An analog-to-digital converter according to the present invention comprising a comparator having first and second inputs, and an output, the comparator comparing an analog input voltage at the first input to a tracking voltage at the second input to place a digital output on the comparator output in response thereto, a voltage switching matrix having an input connected to the output of the comparator and an output, an integrator having an input connected to the output of the voltage switching matrix and an output connected to the second input of the comparator to complete a feedback loop and to provide the tracking signal to the second input of the comparator, and a digital filter coupled to the output of the comparator, the digital filter to form a digital output corresponding to the analog input signal at the first input of the comparator.

20 Claims, 6 Drawing Sheets

ANALOG-TO DIGITAL CONVERTER WITH DELTA-SIGMA MODULATOR

BACKGROUND OF THE INVENTION

1. Field of the Invention

The present invention relates to techniques for analog-to-digital (A/D) conversion. More particularly, the present invention relates to techniques for A/D conversion using a delta-sigma modulator.

2. The Prior Art

Many techniques are known in the prior art for A/D conversion. Each of these A/D techniques has advantages which correspond to the application in which the A/D conversion is being performed. Choosing the A/D conversion technique to be used in a particular application can depend on the consideration of at least the speed, accuracy, cost, dynamic range and power requirements of the application. The spectrum of A/D conversion techniques available in the prior art generally fall into one of two categories.

In the first category are A/D techniques where the analog input signal is directly compared to a digital reference value. The digital value output from the A/D conversion is equal to the digital reference value which most closely compares to the analog input signal. This category of A/D converters is considered fast, however, to obtain high resolution with A/D techniques in this category is generally expensive. A/D techniques for direct comparison include, for example, parallel encoders and the successive approximation method.

In a parallel encoder, there are a plurality of comparators, each of which has the analog input signal connected to a first input. Comparison of the analog input voltage is made to a reference voltage connected to a second input of each of the comparators. The reference voltages supplied to each of the comparators all have different values. The values of the reference voltages are generally evenly spaced. The reference voltage corresponding most closely to the analog input signal as determined by a priority encoder constitutes the digital output of the A/D converter.

The successive approximation method is essentially a binary search performed by comparing the output of a D/A converter with the analog input signal. The value of the output of the D/A converter is usually set by a most significant bit input to the digital side of the D/A converter. The digital inputs to the D/A converter are changed until the analog output value of the D/A converter matches the value of the analog input signal. In a variation of this method, an up/down counter is used to generate the reference values presented to the digital side of the D/A converter. As the analog input changes, the up/down counter changes the reference values presented to the D/A converter to track the analog input voltage.

In the second category are techniques where the analog input is converted into a second quantity which is then used to represent the digital value corresponding to the analog input signal. The second quantity may be, for example, a pulse train at a frequency which varies to represent the value of the analog signal or a specific count generated for a specified time period, wherein the count is proportional to the analog value of the input signal during the specified time period. These techniques include voltage-to-frequency conversion, single-slope integration, dual-slope integration, and delta-sigma modulation.

In a voltage-to-frequency technique, the analog input controls the frequency of a variable frequency oscillator. The oscillator output charges a capacitor which is compared with the analog input signal. The oscillator frequency is varied until the input levels are the same. The frequency of the oscillator is proportional to the analog input signal.

In a single-slope integration, a ramp voltage is generated, usually by storing charge in a capacitor. During the time period the charge is being stored on the capacitor for comparison with the analog input signal, a counter is operating. When the ramp voltage equals the analog input voltage, the counter is stopped. The value in the counter is proportional to the analog input voltage. In a dual-slope integration, during a first fixed time period a current proportional to the analog input signal charges a capacitor. The charge on the capacitor is then discharged to zero at a constant rate. The length of time taken to discharge the capacitor to zero is proportional to the analog input.

In an A/D converter using prior art delta-sigma modulation techniques, an analog input signal is oversampled and fed into a differential amplifier which operates as a summing junction. The differential amplifier sums the analog input with a feedback signal that is the output of the delta-sigma modulator. The output of the differential amplifier thereby represents the change in the value of the analog input signal from one sample to the next.

By feeding back the output of the delta-sigma modulator into the differential amplifier, the output of the differential amplifier is kept at a zero average signal value. Because of this feature, a delta-sigma modulator is alternatively known in the art as a charge-balancing modulator. The successive outputs of the differential amplifier, which in summation represent a zero average signal value, are fed into an integrator for summation. The output of the integrator is fed into a comparator for comparison with a reference value. The comparators employed in the prior art require both positive and negative power supplies and a very accurate midpoint reference such as ground.

When the integrated value is above the reference value, the output of the delta-sigma modulator is a high value, and a high value is fed back to the differential amplifier. When the integrated value is below the reference value, the output of the delta-sigma modulator is a low value, and a low value is fed back to the differential amplifier. However, because the value of the signal being fed back is either a constant high or low value, the output of the differential amplifier cannot be a full rail-to-rail swing.

The high and low signals are treated as up/down signals which are filtered by a digital filter. The digital filter may be, for example, an up/down counter which accumulates the up/down signals. After processing a selected number of analog cycles, the output of the digital filter is used to determine the digital output of the A/D converter. The digital output is the average value of the analog input signal during the time represented by the selected number of analog samples.

One of the major advantages associated with delta-sigma modulators is that low resolution components can be used to process the analog input signal, and a high resolution digital output can be extracted because the analog input signal is oversampled. However, with the ever increasing use of digital signal processing in many different applications, there exists in delta-sigma modulators a need for greater design simplicity, and lower power requirements.

It is therefore an object of the present invention to perform an A/D conversion which converts an analog input voltage across the full scale of ground to Vdd in a comparator.

It is another object of the present invention to perform an A/D conversion using only a single power supply and a ground potential.

It is yet another object of the present invention to perform an A/D conversion with very low power operations.

It is additional object of the present invention to perform an A/D conversion wherein the accuracy of the capacitors in the feedback loop is not a high precision requirement.

BRIEF DESCRIPTION OF THE INVENTION

In a first aspect of the present invention an analog-to-digital converter comprises a comparator having first and second inputs, and an output, wherein the comparator compares an analog input voltage at the first input to a tracking voltage at the second input to place a digital output on the output of the comparator. A first capacitor having a first electrode connected to a first reference voltage and having a second electrode coupled to the first reference voltage in response to a first digital output level from the comparator and coupled to a second reference voltage in response to a second digital output level from the comparator. A second capacitor having a first electrode connected to the first reference voltage and a second electrode coupled to the second electrode of the first capacitor by at least one switching device and connected to the second input of the comparator, and the second capacitor storing the tracking voltage for comparison to the analog input voltage by the comparator. A digital filter coupled to the output of the amplifier, the digital filter to form a digital output corresponding to the analog input voltage at the first input of the comparator.

In a second aspect of the present invention the comparator comprises a positive comparator having a first input coupled to the analog input voltage, a second input coupled to the tracking voltage, an enable input coupled to a first select signal which enables the positive comparator when the analog input signal is greater than a preset voltage level, a strobe input coupled to a strobe signal to turn on the positive comparator, and an output, a negative comparator having a first input coupled to the analog input voltage, a second input coupled to the tracking voltage, an enable input coupled to a second select signal to enable the negative comparator when the analog input voltage is less than approximately one-half of full scale, a strobe input coupled to the strobe signal to turn on the negative comparator, and an output, and an output module having a first input connected to the output of the positive comparator and a second input connected to the output of the negative comparator, and first and second outputs to provide the first and second digital output levels from the comparator.

In a third aspect of the present invention the digital filter comprises an up/down counter having an input coupled to the output of the comparator, an enable input, a reset input, and an output, an up counter having an enable/count input, and an overflow output coupled to a reset input; the overflow output coupled to the reset input of the up/down counter, and a register having a data input connected to the output of the up/down counter, and an enable input connected to the overflow output of the up counter.

In a fourth aspect of the present invention the analog-to-digital converter further includes a preamplifier having an input connected to the analog input voltage, and an output connected to the first comparator input, the preamplifier to provide gain to the analog input signal to normalize the analog input voltage to be in a range of about one-half to all of a rail-to-rail potential of the comparator.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
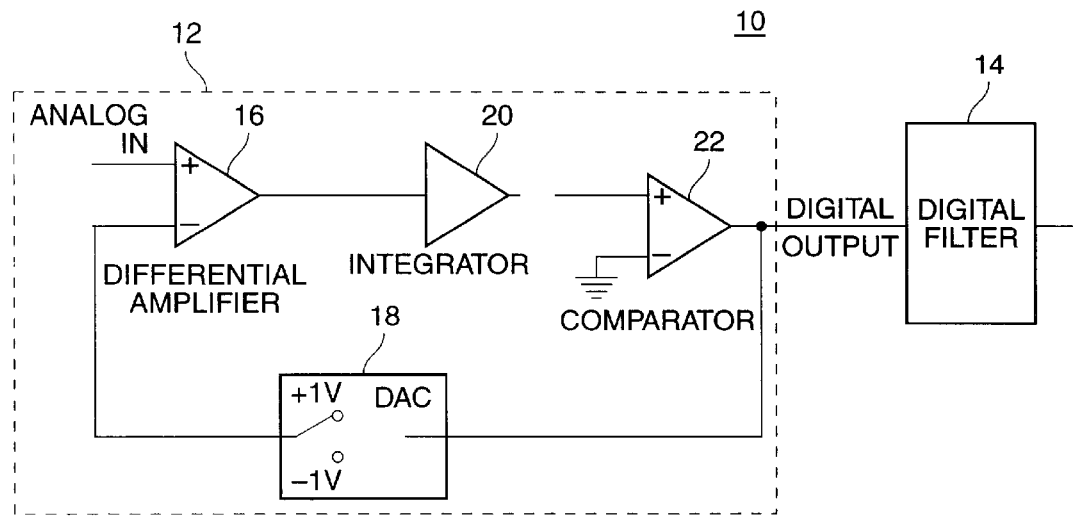
FIG. 1 is a block diagram of an A/D conversion circuit using a delta-sigma modulator according to the prior art.

The present invention is directed to circuitry for A/D conversion using a modified delta-sigma modulator. FIG. 1 represents a generalized embodiment of an A/D converter 10 with a delta-sigma modulator 12, as described in the prior art section. The A/D converter 10 includes a delta-sigma modulator 12 and a digital filter 14. The delta-sigma modulator 12 typically samples an analog input signal well above the Nyquist rate (oversampled) and the digital filter 14 may typically be an up/down counter. By oversampling the analog input signal and processing it with low resolution components at a much higher rate than the bandwidth of the analog input signal, the analog input signal can be extracted to a high digital resolution using low resolution components.

In the delta-sigma modulator 12, a differential amplifier 16 receives the oversampled analog input signal at a first input. The output of the delta-sigma modulator 12 is fed back through a digital-to-analog converter (DAC) 18 to a second input of the differential amplifier 16. Because the feedback signal to the differential amplifier 16 is either a constant high or low value, the peak values of the analog input signal cannot go rail-to-rail. The differential amplifier 16 is also conventionally depicted as a summing node as is well known to those of ordinary skill in the art.

The output of the differential amplifier 16 is fed to an integrator 20 which sums the incremental change in the value of analog input signal from sample to sample. The summed value of the integrator 20 is output and fed into a first input of a comparator 22. The second input to the comparator 22 is connected to a reference voltage, most typically ground. The comparator 22 performs an A/D function, and the output from comparator 22 is typically a single bit output, though it is known in the art to also be a multi-bit output. The comparator 22 in the prior art requires both positive and negative power supplies and a well defined midpoint reference (ground).

The output from the comparator 22 is fed into both the digital filter 14 and the DAC 18. The digital filter 14 is typically an up/down counter which counts the digital signals output from the comparator 22. The count made during a selected time period known as the conversion cycle is proportional to the digital value of the average analog input signal value during the conversion cycle. The DAC 18 is ideally complementary to the comparator 22 performing the A/D function, thereby reconverting the digital signal output from the comparator 22 to the analog signal being fed back into differential amplifier 16.

The operation of the prior art delta-sigma modulator 12 may be understood by considering an analog value that is being output from the integrator 20 and compared with ground as a typical reference voltage in comparator 22. When the analog value is greater than ground, the comparator 22 will output a HIGH digital value, and when the analog value is less than ground, the comparator 22 will output a LOW digital value. The digital filter 14 will count up for each HIGH digital value, and will count down for each LOW digital value. In response to a HIGH digital value, the DAC 18 will feed a high analog signal, shown as +1 volt, back to the second input of the differential amplifier 16. In response to a LOW digital value, the DAC 18 will feed a low analog signal, shown as −1 volt, back to the second input of the differential amplifier 16. The analog signal being fed back is summed with the analog input signal being fed into the first input of the differential amplifier 16.

The output of the differential amplifier 16 is the incremental change in the value of the analog input signal. By feeding the analog representation of the output of the comparator 22 back into the differential amplifier 16, the output of the differential amplifier 16 is kept at a zero average signal value so that only a value proportional to the incremental change in the value of the analog input signal is summed with the previous value of the analog input signal by the integrator 20. Because of this feature, a delta-sigma modulator is alternatively known in the art as a charge balancing modulator. The output of the integrator 20 is then compared with the reference signal in the comparator 22, as previously explained.

Figure 2:
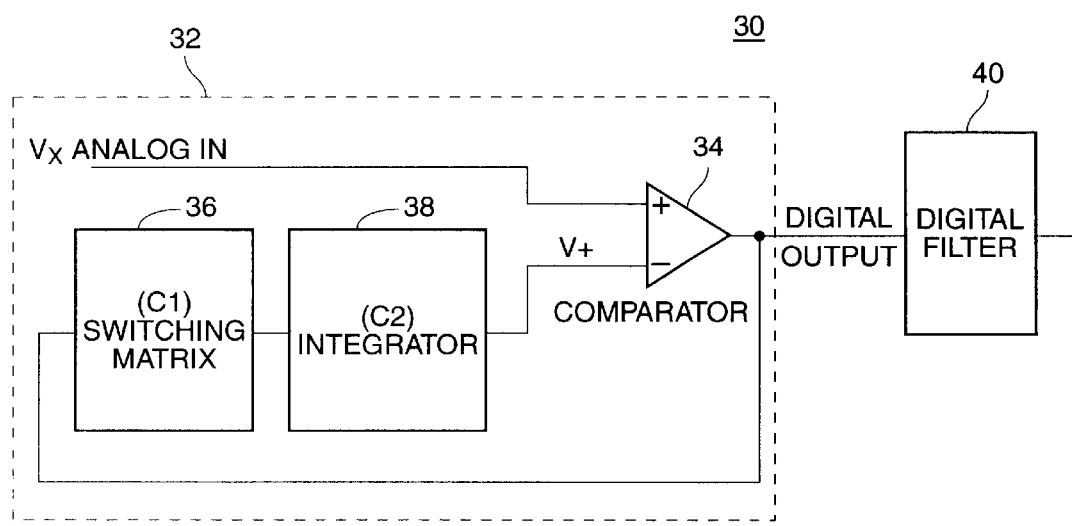
FIG. 2 is a block diagram of an A/D conversion circuit using a modified delta-sigma modulator according to the present invention.

In FIG. 2, an A/D converter 30 for converting an analog input voltage to a digital output voltage using a modified delta-sigma modulator 32 according to the present invention is shown. In the modified delta-sigma modulator 32, a comparator 34 has a first input connected to an analog input voltage $V_x$. The analog input voltage is oversampled to an extent that is well above the Nyquist rate. It should be appreciated that $V_x$ may be sampled and held at the beginning of each conversion cycle, and then provided to the first input of the comparator 34 during the entire conversion cycle. Otherwise, $V_x$ may be fed directly to the first input of the comparator 34 during the entire conversion cycle.

A second input to the comparator 34 is connected in a feedback loop to the output of the modified delta-sigma modulator 32. Connected in series in the feedback loop are a voltage switching matrix 36, and an integrator 38. In the feedback loop, the output of the comparator 34 is connected to the input of voltage switching matrix 36, the output of the voltage switching matrix 36 is connected to the input of the integrator 38, and the output of the integrator 38 is connected to the second input of the comparator 34. The output voltage from the integrator 38 being fed to the second input of the comparator 34 is a tracking voltage, $V_t$, which tracks the analog input voltage, $V_x$.

Comparator 34 is strobeable so that comparator 34 is turned on only when a compare is being performed. This is a significant advantage because it permits lower power operation. Also, unlike the prior art, which requires two power supplies and a very stable midpoint reference value (ground), the present invention requires only a single power supply and a ground potential. In the present invention, $V_t$ is compared to $V_x$ to determine whether $V_x$ is moving up or down. In the prior art A/D converter 10 shown in FIG. 1, the change in the analog input signal is first determined with the differential amplifier 16 and integrator 20 and then compared with a reference to see whether the value of the analog input signal is increasing or decreasing. The direct comparison of $V_t$ with $V_x$ in the present invention simplifies the design of the delta-sigma converter and reduces power requirements.

In the present invention, as the tracking voltage $V_t$ follows the voltage $V_x$, the tracking voltage $V_t$ moves up and down in discrete steps as it rises above and falls below the input voltage $V_x$. The up and down steps are accumulated in a digital filter 40 having a digital output proportional to $V_x$. As will be explained below, the size of the discrete steps by which $V_t$ moves are variable and a function of the value of $V_t$ relative to the full scale of the comparator 34. This enables the analog input voltage to swing to the rails of the comparator 34. Not shown in FIG. 2 is a preamplifier for the analog input voltage that can scale the analog input voltage until the peak values of the analog input voltage lie in a normalized range equal to one-half the full scale between the rail voltages of the comparator 34.

Figure 3:
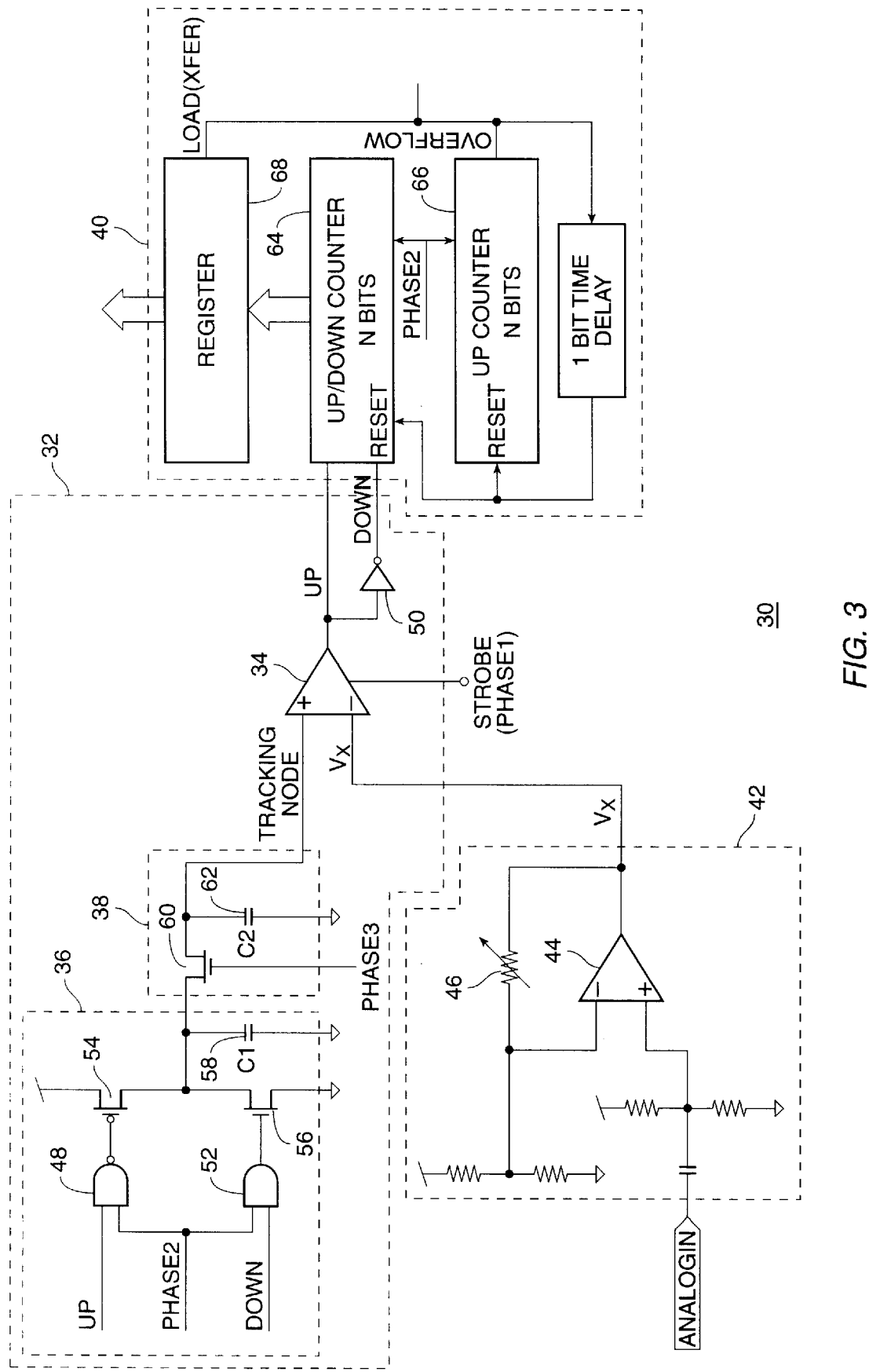
FIG. 3 is a schematic of an A/D conversion circuit using a modified delta-sigma modulator according to the present invention.

In FIG. 3, the A/D converter 30 according to the present invention is shown in more detail. To avoid unnecessary duplication of reference numerals, elements in FIG. 3 which correspond to elements in FIG. 2 are given the same reference numerals in both figures. In the modified delta-sigma modulator 32, the comparator 34 has a first input connected to the analog input voltage $V_x$ through a preamplifier 42. In the preferred embodiment, the preamplifier 42 has $2^n$ settings, where n is the number of bits used to set the gain of the preamplifier 42. For example, if there are 2 bits to set the gain of the preamplifier 42, the gain can be any of four different values. The preamplifier 42 is shown comprising an operational amplifier 44 whose gain can be varied by the variable resistor 46 in a feedback loop. Those of ordinary skill in the art will readily recognize that various implementations of the preamplifier 42 may be made.

The second input of comparator 34 is connected by a feedback loop to the output of the modified delta-sigma modulator 32. In the feedback loop, the output of comparator 34 is fed into a first input (labelled UP) of a NAND gate 48, and the output of the comparator 34 through inverter 50 is fed into a first input (labelled DOWN) of an AND gate 52. The second inputs of both NAND gate 48 and AND gate 52 are connected to a timing signal to be explained below. The output of NAND gate 48 and the output of AND gate 52 are connected respectively to the gates of the P-channel MOS transistor 54 and N-channel MOS transistor 56 totem pole pair. In the totem pole pair, the source of the P-channel MOS transistor 54 is connected to Vdd, the source of the N-channel MOS transistor 56 is connected to ground, and the drains of P-channel MOS transistor 54 and N-channel MOS transistor 56 are connected together to form a common node.

The common node formed by the drains of P-channel MOS transistor 54 and N-channel MOS transistor 56 are connected to a first electrode of a first capacitor 58. The second electrode of the first capacitor 58 is connected to ground. NAND gate 48, AND gate 52, P-channel MOS transistor 54, N-channel MOS transistor 56 and first capacitor 58 comprise the voltage switching matrix 36. Also connected to the first electrode of the first capacitor 58 is a first source/drain of an MOS pass transistor 60. The first electrode of a second capacitor 62 is connected to a second source/drain of MOS pass transistor 60. The gate of MOS pass transistor 60 is connected to a timing signal to be explained below. The first electrode of second capacitor 62 is also connected to the second input of the comparator 34 to complete the feedback loop. The second electrode of the second capacitor 62 is connected to ground. The MOS pass transistor 60 and second capacitor 62 comprise the integrator 38.

In a first embodiment of the present invention, A/D converter 30 has a three phase operation. A second embodiment of the present invention, which uses two phase operation, will be explained below. During a first phase of the three phase embodiment, the comparator 34 is strobed with a phase1 signal, and $V_x$ at a first input is compared with $V_t$ at a second input. When $V_x$ is greater than $V_t$, a HIGH logic signal is output by comparator 34, and when $V_x$ is less than $V_t$, a LOW logic signal is output by comparator 34. The output and inverted output of comparator 34 are fed back to NAND gate 48 and AND gate 52, respectively, and are also fed to an up/down counter 64.

During a second phase, a HIGH logic phase2 signal is input to both NAND gate 48 and AND gate 52. In the second phase, when a HIGH logic signal output from comparator 34 is presented to NAND gate 48 along with the HIGH logic phase2 signal, and a LOW logic signal as the inverted output of comparator 34 is presented to AND gate 52, the output of both NAND gate 48 and AND gate 52 will be LOW. This will turn on P-channel MOS transistor 54 and will turn off N-channel MOS transistor 56. As a result, the first capacitor 54 will be charged to Vdd.

Alternatively, when in the second phase, a LOW logic signal output from comparator 34 is presented to NAND gate 48, and a HIGH logic signal as the inverted output from comparator 34 is presented to AND gate 52 along with the HIGH logic phase2 signal, the output of both NAND gate 48 and AND gate 52 will be HIGH. This will turn off P-channel MOS transistor 54 and will turn on N-channel MOS transistor 56. As a result, the first capacitor 58 will be discharged to ground.

In the third phase of operation, MOS pass transistor 60 is turned on by a phase3 signal, and charge is transferred between first capacitor 58 and second capacitor 62. The direction of the charge transfer depends on whether first capacitor 58 is charged or discharged during the second phase of operation. When first capacitor 58 is charged during the second phase because $V_x$ is greater than $V_t$, charge is transferred to the second capacitor 62 to raise $V_t$. Otherwise, when first capacitor 58 is discharged during the second phase because $V_x$ is less than $V_t$, charge is transferred from second capacitor 62 to lower $V_t$.

The amount by which $V_t$ increases or decreases in response to the feedback from comparator 34 can be readily understood by the application of several well known principles regarding capacitance. First, it is known that during the second phase when P-channel MOS transistor 54 is turned on, the charge Q1 on the first capacitor 58 will be Vdd×C1, where C1 is the capacitance of the first capacitor 58. During the second phase, the charge on the second capacitor 62, $V_t$×C2, where C2 is the capacitance of the second capacitor 62, will not be affected. Thus, at the end of the second phase, the total charge Qt on both the first and second capacitor 58 and 62 will be Vdd×C1+$V_t$×C2. During the third phase, the MOS pass transistor 60 is turned on, and charge will be transferred between first capacitor 58 and second capacitor 62 until the voltage on both the first and second capacitors 58 and 62 is the same because the first and second capacitors 58 and 62 are in parallel. This voltage, $V_{t\text{-}new}$, is the total charge Qt (i.e. Vdd×C1+$V_t$×C2) divided by the total capacitance C1+C2 of first and second capacitors 58 and 62 as follows:

$$V_{t\text{-}new}=(Vdd\times C1+V_t\times C2)/(C1+C2).$$

Subtracting the previous tracking voltage $V_t$ from $V_{t\text{-}new}$ will give the increase in the tracking voltage $\Delta V_{tup}$ as follows:

$$\Delta V_{tup}=((C1/(C1+C2))(Vdd-V_t).$$

The corresponding decrease in the tracking voltage $\Delta V_{t\text{-}up}$ when N-channel MOS transistor 56 has been turned on to discharge first capacitor 58 is given as follows:

$$\Delta V_{tdown}=((C1/(C1+C2))(ground-V_t).$$

Figure 4:
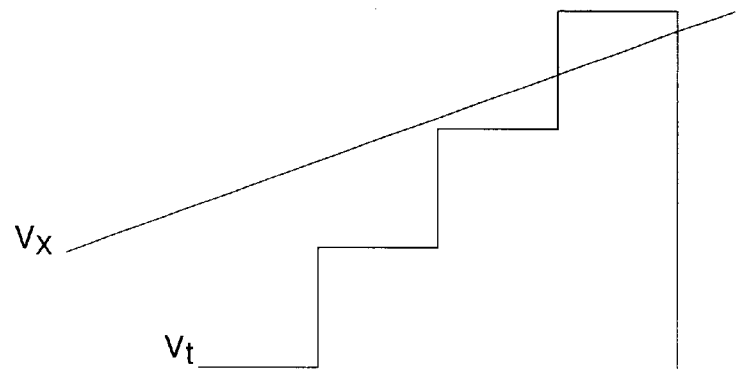
FIG. 4 is a signal diagram of an analog input voltage and a tracking voltage according to the present invention.

From these derivations it can be seen that when: 1) $V_x$ is above the midpoint between ground and Vdd, and $V_t$ is approaching Vdd; or 2) $V_x$ is below the midpoint between ground and Vdd and $V_t$ is approaching ground, that $\Delta V_t$ becomes smaller. This aspect of the present invention is a substantial advantage over the prior art because it allows the analog input voltage to swing to the rails of comparator 34. FIG. 4 is a signal diagram depicting $V_t$ and $V_x$. In the signal diagram, $V_x$ is above the midpoint between ground and Vdd. It can be seen that as $V_t$, which starts lower than $V_x$, steps up to follow $V_x$, the increment of the steps become smaller, and once $V_t$, rises above $V_x$, the absolute value of the step down is larger than absolute value of the steps up.

The ratio of the second capacitor 62 to the first capacitor 58 is an important consideration though the ratio need not be extremely accurate. The greater the ratio, up to about 128:1, the smaller the average incremental change in $V_t$ with respect to $V_x$ will be. In the preferred embodiment, a ratio of 64:1 was implemented for an 8-bit A/D converter.

In prior art A/D converters using sigma-delta modulation, the value of the signal output from the integrator representing the incremental change in the analog input signal is compared with a reference. As a result of the comparison, uniform amounts of voltage or current are added or subtracted from the analog input signal at the summing junction to cancel the analog input signal. Because the voltage or charge added or subtracted is uniform, the analog input signal cannot swing rail-to-rail.

As explained above, the output from the modified delta-sigma modulator 32, in addition to being fed back to the input of the comparator 34 through the feedback loop, is also fed into a digital filter 40. As shown in FIG. 3, the output and the inverted output of the comparator 34 are both connected to an up/down counter 64. During the second phase, the phase2 signal is also applied to an enable input of up/down counter 64. When the phase2 signal is applied to the enable input of up/down counter 64, the count in the up/down counter 64 will go up if the output from the comparator 34 is a HIGH logic level, and the count in the up/down counter 64 will go down if the output from the comparator 34 is a LOW logic level.

In the A/D converter 30 of the present invention, a conversion of the average analog input voltage is made to a digital value over a selected time period or conversion cycle. The digital value in the digital filter 40 is proportional to the average value of the analog input voltage during the conversion cycle. In each conversion cycle, the number of times $V_t$ is compared with $V_x$ is equal to the number of up signals plus the number of down signals. Each compare in the conversion cycle is tallied by an up counter 66 having a count/enable input connected to the phase2 signal. The difference between the number of up signals and the number of down signals is tallied in the up/down counter 64. The ratio of the difference between the up signals and the down signals to the total number of up and down signals is related to the average value of $V_t$ for the entire conversion cycle according to the following relation:

$$(up_{counts} - down_{counts})/(up_{counts} + down_{counts}) = (V_t - midscale)/fullscale$$

In the digital filter 40, each time a phase2 signal is applied to the up/down counter 64, a phase2 signal is also applied to up counter 66. When the up counter 66 reaches the value for the number of compares to be performed during the conversion cycle, an overflow condition occurs, and an overflow signal is sent to register 68. The value in the up/down counter 64 is latched into register 68 when the overflow signal is received by the register 68. The digital value of the analog signal stored in register 68 is then available for use. The overflow signal is also fed through a one bit time delay 70 to the up/down counter 64 and the up counter 66 to reset both the up/down counter 64 and the up counter 66 to zero. When $V_x$ is provided to the comparator 34 by a sample and hold circuit, the overflow signal is also provided as XFER signal to a transfer circuit. As will be described below, the transfer circuit sets $V_t$ equal to $V_x$ at the beginning of each conversion cycle.

Figure 5:
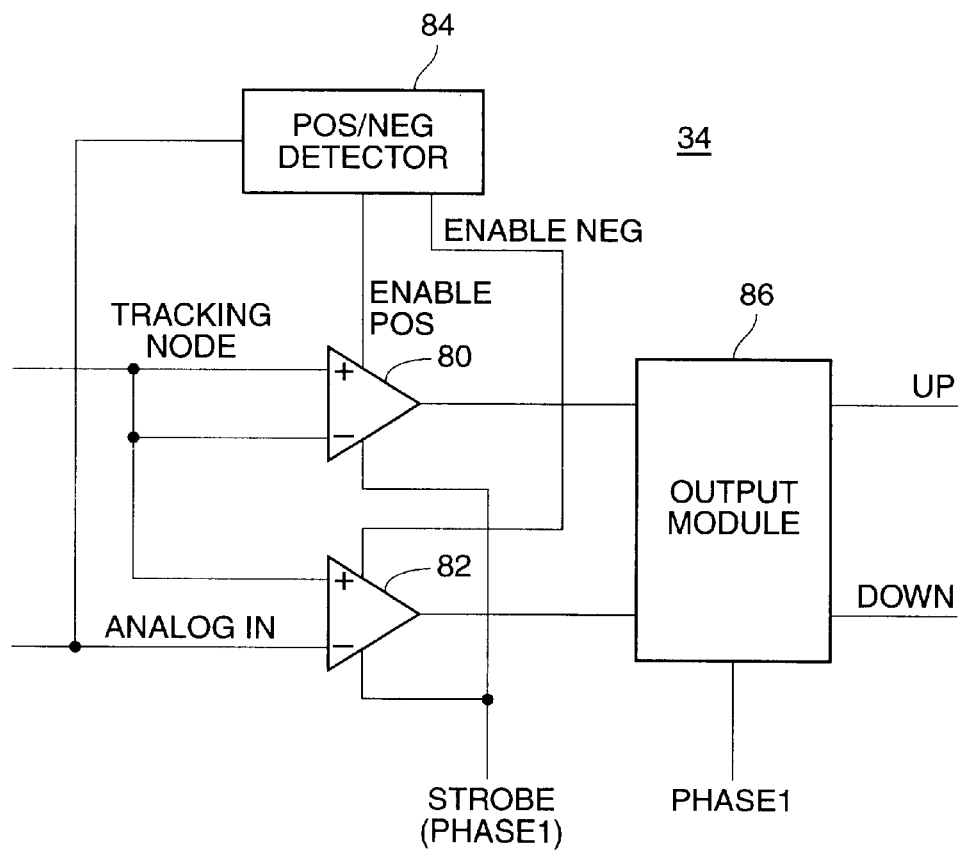
FIG. 5 is a block diagram of positive and negative comparators suitable for use in the modified delta-sigma modulator according to the present invention.

In the preferred embodiment, the comparator 34 comprises a pair of positive and negative comparators. A positive comparator performs the comparison between $V_x$ and $V_t$ when $V_x$ is above a midpoint between ground and Vdd, and a negative comparator performs the comparison between $V_x$ and $V_t$ when $V_x$ is below a midpoint between ground and Vdd. FIG. 5 is a circuit diagram of comparator 34 showing both a positive comparator 80 and a negative comparator 82.

Turning now to FIG. 5, $V_x$ is transmitted to a first input of both the positive and negative comparators 80 and 82, and is also input to midpoint detector 84 to determine whether $V_x$ is above the midpoint between ground and Vdd or below the midpoint between ground and Vdd. The accuracy required of detector 84 is not very great, so that an inverter with a switching point at mid-supply will be sufficient for the present invention. Those of ordinary skill in the art will be readily aware of other schemes available to detect whether $V_x$ is above or below the midpoint between ground and Vdd. When $V_x$ is above the midpoint between ground and Vdd, the output from the midpoint detector 84 enables the positive comparator 80 with an ENPOS signal, and when $V_x$ below the midpoint between ground and Vdd, the output from the midpoint detector 84 enables the negative comparator 82 with an ENNEG signal.

$V_t$ is fed to a second input in both the positive and negative comparators 80 and 82. As the positive and negative comparators 80 and 82 are strobed by the phase1 signal, the positive or negative comparator 80 or 82 which is enabled will compare $V_x$ to $V_t$, and will output either a HIGH or LOW logic signal to comparator output module 86. To reduce the power consumption of the modified delta-sigma modulator 32, the positive and negative comparators 80 and 82 draw current only briefly when making the comparison between $V_x$ to $V_t$. The HIGH and LOW logic outputs from positive and negative comparators 80 and 82 are maintained for other portions of the modified delta-sigma modulator 32 shown in FIG. 3, by the comparator output module 86. The HIGH and LOW logic outputs from positive and negative comparators 80 and 82 are passed into the comparator output module 86 by the phase1 signal.

Figure 6A:
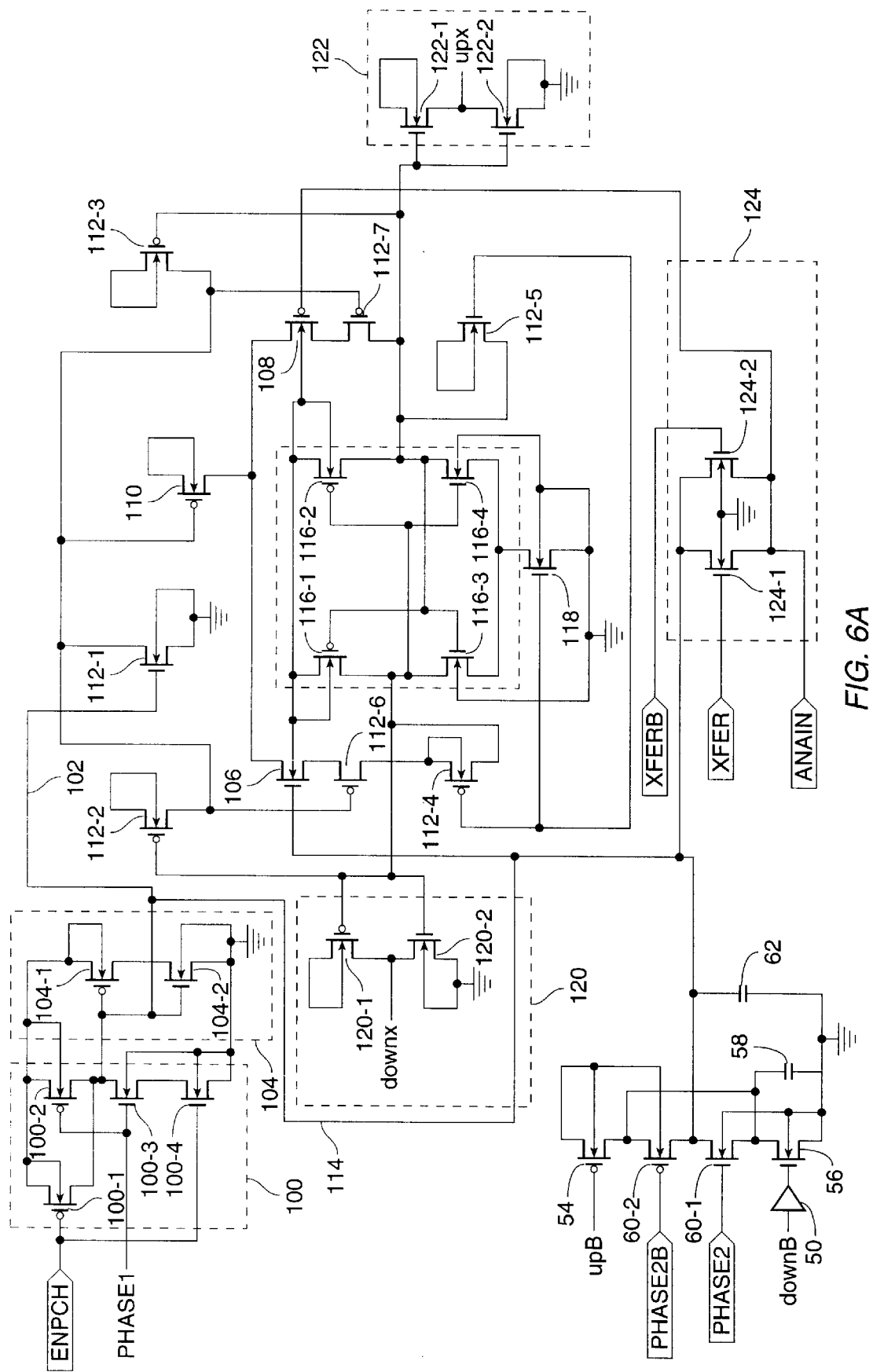
FIG. 6A is a circuit diagram of a negative comparator suitable for use in the modified delta-sigma modulator according to the present invention.
Figure 6B:
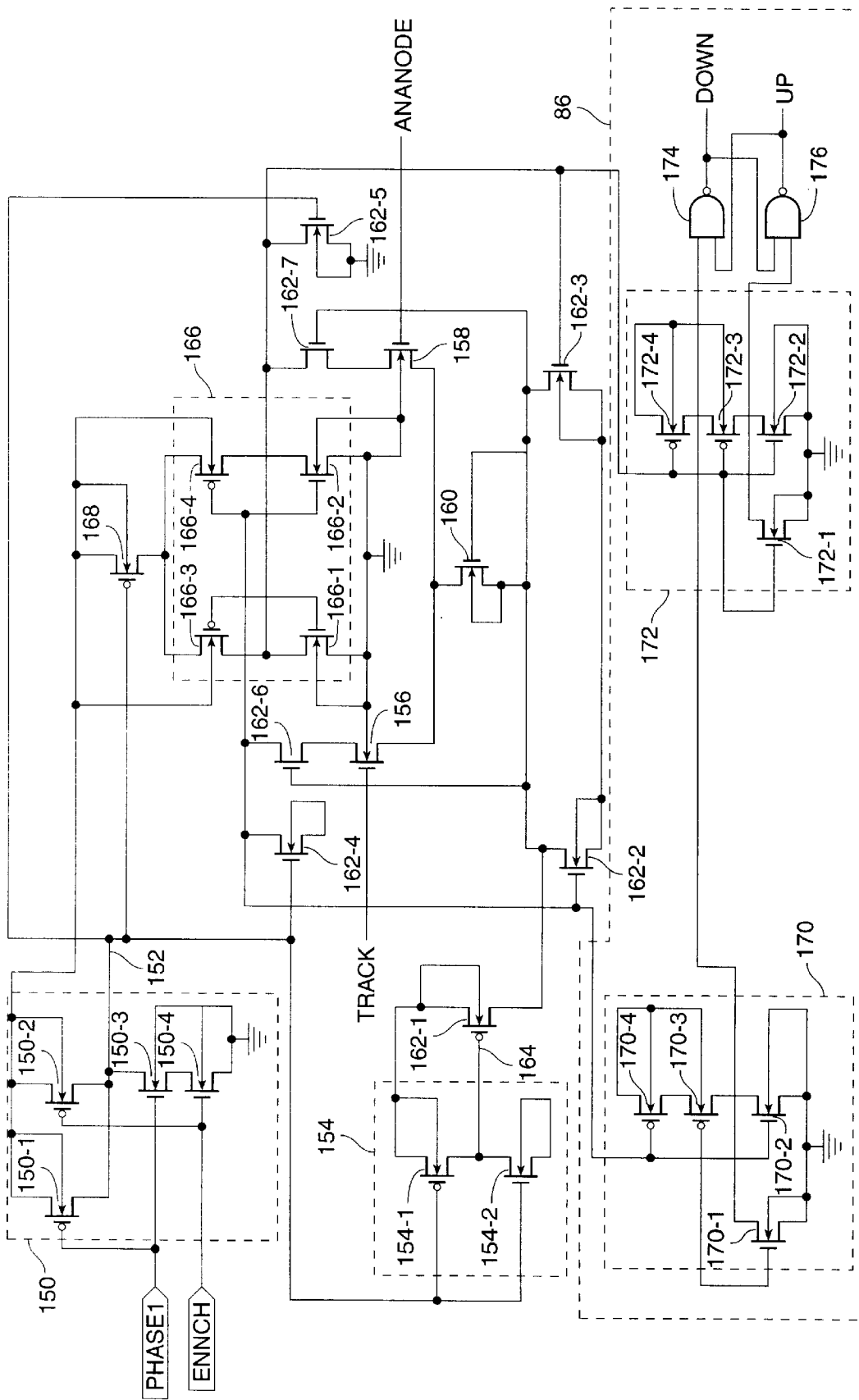
FIG. 6B is a circuit diagram of a positive comparator suitable for use in the modified delta-sigma modulator according to the present invention.

In FIGS. 6A and 6B, a circuit diagram of the modified delta-sigma modulator 32 is shown. To avoid unnecessary duplication of reference numerals, elements in FIGS. 6A and 6B which correspond to elements in FIGS. 2, 3 and 5 are given the same reference numerals in both figures. FIG. 6A is circuit diagram of the voltage switching matrix 36, the integrator 38 and the negative comparator 80. FIG. 6B is a circuit diagram of the positive comparator 82 and the output module 86.

The circuit diagrams of FIGS. 6A and 6B are for the two phase embodiment of the modified delta-sigma modulator. In the first phase of the two-phase embodiment, the tracking voltage and analog input voltage are compared, and first capacitor 58 is either charged or discharged. In the second phase, charge is transferred between first capacitor 58 and second capacitor 62, and the up/down counter 64 and up counter 66 are enabled. The differences between the two phase embodiment shown in FIGS. 6A and 6B and the three phase embodiment shown in FIG. 3 will be pointed out in the discussion of FIGS. 6A and 6B given below.

Turning now to FIG. 6A, an ENNEG (enable negative comparator) signal from midpoint detector 84 in FIG. 5 and a strobe (phase1 signal) are input to a four transistor NAND gate 100 comprising P-channel MOS transistors 100-1 and 100-2, and N-channel MOS transistors 100-3 and 100-4. The output 102 of NAND gate 100 is connected to an inverter 104 comprising P-channel MOS transistor 104-1 and N-channel MOS transistor 104-2. The configurations of both NAND gate 100 and inverter 104 are well known to those of ordinary skill in the art, and will not be described in detail to avoid over-complicating the disclosure of the present invention.

In the negative comparator 82, the tracking voltage and the analog input voltage are compared by the P-channel MOS differential transistor pair 106 and 108. Current is steered into the P-channel MOS differential transistor pair 106 and 108 by P-channel MOS transistor 110. The low power operation of the positive and negative comparators 80 and 82 is an important aspect of the present invention. To achieve low power operation in the negative comparator 82, N-channel MOS transistor 112-1 and P-channel MOS transistors 112-2 through 112-7 are employed to limit current flow through the P-channel MOS differential transistor pair 106 and 108 to a relatively short time while the negative comparator 82 is enabled.

The sources of the P-channel differential MOS transistor pair 106 and 108 are connected to the drain of the current steering P-channel MOS transistor 110. The source of P-channel MOS transistor 1 10 is connected to Vdd, and the gate of P-channel MOS transistor 110 is connected the drain of N-channel MOS transistor 112-1, the gates of P-channel MOS transistors 112-6 and 112-7, and the drains of P-channel MOS transistors 112-2 and 112-3. The source of N-channel MOS transistor 112-1 is connected to ground, and the sources of P-channel MOS transistors 112-2 and 112-3 are connected to Vdd along with the sources of P-channel MOS transistors 112-4 and 112-5. The drain of differential P-channel MOS transistor 106 is connected to the source of P-channel MOS transistor 112-6. The drain of P-channel MOS transistor 112-4 is connected to a common node, LEFTB along with the drain of P-channel MOS transistor 112-6 and the gate of P-channel MOS transistor 112-2. The drain of differential P-channel MOS transistor 108 is connected to the source of P-channel MOS transistor 112-7. The drain of P-channel MOS transistor 112-5 is connected to a common node, RIGHTB, along with the drain of P-channel MOS transistor 112-7 and the gate of P-channel MOS transistor 112-3. The gate of an N-channel MOS transistor 112-1 is connected to the output 102 of NAND gate 100, and the gates of P-channel MOS transistors 112-4 and 112-5 are connected to the output 114 of inverter 104.

When the negative comparator 82 is not enabled, a HIGH logic signal on the output 102 of NAND gate 100 turns on N-channel MOS transistor 112-1 to place a ground potential at the gate of P-channel MOS transistor 110, and thereby turn on P-channel MOS transistor 110. When P-channel MOS transistor 110 which is turned on, current is steered into the P-channel MOS differential transistor pair 106 and 108. However, current does not flow through the differential MOS transistor pair 106 and 108 due to the action of P-channel MOS transistors 112-4 and 112-5.

The drains of the differential MOS transistor pair 106 and 108 are connected to the nodes LEFTB and RIGHTB, through P-channel MOS transistors 112-6 and 112-7, respectively. A LOW logic signal from inverter 104, when the negative comparator 82 is not enabled, turns on P-channel MOS transistors 112-4 and 112-5 to hold the nodes LEFTB and RIGHTB at Vdd, and thereby prevent current flow through the differential P-channel MOS transistor pair 106 and 108.

A latch 116 is formed by P-channel MOS transistors 116-1 and 116-2 and N-channel MOS transistors 116-3 and 116-4 as is well known in the art. The latch 116 is enabled by N-channel MOS transistor 118 whose gate is connected to the output 114 of inverter 104. When the negative comparator 82 is not enabled, the inverter 104 provides a LOW logic signal to N-channel MOS transistor 118 and the latch 116 is not enabled. When the latch 116 is enabled, the values being held are latched at nodes LEFTB and RIGHTB.

When the negative comparator 82 is enabled, the NAND gate 100 output goes LOW, and inverter 104 output goes HIGH. The HIGH inverter 104 output turns off P-channel MOS transistors 112-4 and 112-5, so that the LEFTB and RIGHTB nodes are no longer held at Vdd, and also turns on N-channel MOS transistor 118 to enable the latch 116. The LOW NAND gate 100 output turns off N-channel MOS transistor 112-1.

Once the LEFTB and RIGHTB nodes are not held at Vdd, the differential pair of P-channel MOS transistors 106 and 108 connected to $V_t$ and $V_x$, respectively, will begin conducting. As a result, when $V_t$ is less than $V_x$, a HIGH logic level will be latched at node LEFTB and a LOW logic level will be latched at node RIGHTB. Whereas, when $V_t$ is greater than $V_x$, a LOW logic level will be latched at node LEFTB and a HIGH logic level will be latched at node RIGHTB. A LOW logic level at either node LEFTB or node RIGHTB will turn on either of P-channel MOS transistors 112-2 or 112-3, respectively. When either of P-channel MOS transistors 112-2 or 112-3 is turned on, a HIGH logic level is provided to the gates of P-channel MOS transistors 110, 112-6 and 112-7 to prevent current from flowing through the differential pair of P-channel MOS transistors 106 and 108.

The LEFTB node is also connected to the input of an inverter 120 comprising P-channel MOS transistor 120-1 and N-channel MOS transistor 120-2. The output of inverter 120 forms a DOWNX node. The RIGHTB node is also connected to the input of an inverter 122 comprising P-channel MOS transistor 122-1 and N-channel MOS transistor 122-2. The output of inverter 122 forms an UPX node. The DOWNX and UPX nodes correspond to the up and down outputs, respectively, of negative comparator 82. As will be described with reference to FIG. 6B, the up and down outputs of the negative comparator 82 are NORed in the output module 86 with the up and down outputs of positive comparator 80.

Turning now to FIG. 6B, the positive comparator 80 and the output module 86 will be described. In positive comparator 80, an ENPOS (enable positive comparator) signal from midpoint detector 84 in FIG. 5 and a strobe (phase1 signal) are input to a four transistor NAND gate 150 comprising P-channel MOS transistors 150-1 and 150-2, and N-channel MOS transistors 150-3 and 150-4. The output 152 of NAND gate 150 is connected to an inverter 154 comprising P-channel MOS transistor 154-1 and N-channel MOS transistor 154-2. The configurations of both NAND gate 150 and inverter 154 are well known to those of ordinary skill in the art, and will not be described in detail to avoid over-complicating the disclosure of the present invention.

In the positive comparator 80, the tracking voltage and the analog input voltage are compared by the N-channel MOS differential transistor pair 156 and 158. A ground potential is provided to the sources of N-channel MOS differential transistor pair 156 and 158 by N-channel MOS transistor 160. The low power operation of the positive and negative comparators 80 and 82 is an important aspect of the present invention. To achieve low power operation in the negative comparator 80, P-channel MOS transistor 162-1 and N-channel MOS transistors 162-2 through 162-7 are employed to limit current flow through the N-channel MOS differential transistor pair 156 and 158 to a relatively short time while the positive comparator 80 is enabled.

The sources of the N-channel differential MOS transistor pair 156 and 158 are connected to the drain of the current steering N-channel MOS transistor 160. The source of N-channel MOS transistor 160 is connected to ground, and the gate of N-channel MOS transistor 160 is connected the drain of P-channel MOS transistor 162-1, the gates of N-channel MOS transistors 162-6 and 162-7, and the drains of N-channel MOS transistors 162-2 and 162-3. The source of P-channel MOS transistor 162-1 is connected to Vdd, and the sources of N-channel MOS transistors 162-2 and 162-3 are connected to ground along with the sources of N-channel MOS transistors 162-4 and 162-5. The drain of differential N-channel MOS transistor 156 is connected to the source of N-channel MOS transistor 162-6. The drain of N-channel MOS transistor 162-4 is connected to a common node, LEFT along with the drain of N-channel MOS transistor 162-6 and the gate of N-channel MOS transistor 162-2. The drain of differential N-channel MOS transistor 158 is connected to the source of N-channel MOS transistor 162-7. The drain of N-channel MOS transistor 162-5 is connected to a common node, RIGHT, along with the drain of the N-channel MOS transistor 162-7 and the gate of N-channel MOS transistor 162-3. The gate of an P-channel MOS transistor 162-1 is connected to the output 164 of inverter 164, and the gates of N-channel MOS transistors 162-4 and 162-5 are connected to the output 152 of NAND gate 150.

When the positive comparator 80 is not enabled, a LOW logic signal on the output 164 of inverter 154 turns on P-channel MOS transistor 162-1 to drive the gate of N-channel MOS transistor 160 with Vdd, and thereby turn on N-channel MOS transistor 160. When N-channel MOS transistor 160 which is turned on, the sources of the differential N-channel MOS transistor pair 156 and 158 are coupled to a ground potential. However, current does not flow through the differential N-channel MOS transistor pair 156 and 158 due to the action of N-channel MOS transistors 162-4 and 162-5.

The drains of the differential N-channel MOS transistor pair 156 and 158 are connected to the nodes LEFT and RIGHT through N-channel MOS transistors 162-6 and 162-

7, respectively. A HIGH logic signal from NAND gate 150, when the positive comparator 80 is not enabled, turns on N-channel MOS transistors 162-4 and 162-5 to hold the nodes LEFT and RIGHT at ground, and thereby prevent current flow through the differential N-channel MOS transistor pair 156 and 158.

A latch 166 is formed by N-channel MOS transistors 166-1 and 166-2 and P-channel MOS transistors 166-3 and 166-4 as is well known in the art. The latch 166 is enabled by P-channel MOS transistor 168 whose gate is connected to the output 152 of NAND gate 150. When the positive comparator 80 is not enabled, the NAND gate 150 provides a HIGH logic signal to P-channel MOS transistor 168 and the latch 166 is not enabled. When the latch 166 is enabled, the values being held are latched at nodes LEFT and RIGHT.

When the positive sense amplifier 80 is enabled, the NAND gate 150 output goes LOW, and inverter 154 output goes HIGH. The LOW NAND gate 150 output turns off N-channel MOS transistors 162-4 and 162-5, so that the LEFT and RIGHT nodes are no longer held at ground, and also turns on P-channel MOS transistor 168 to enable latch 166. The HIGH inverter 154 output turns off P-channel MOS transistor 162-1.

Once the LEFT and RIGHT nodes are not held at ground, the differential P-channel MOS transistor pair 156 and 158 connected to $V_t$ and $V_x$, respectively, will begin conducting. As a result, when $V_t$ is less than $V_x$, a HIGH logic level will be latched at node LEFT and a LOW logic level will be latched at node RIGHT. Whereas, when $V_t$ is greater than $V_x$, a LOW logic level will be latched at node LEFT and a HIGH logic level will be latched at node RIGHT. A HIGH logic level at either node LEFT or node RIGHT will turn on either of N-channel MOS transistors 162-2 or 162-3, respectively. When either of N-channel MOS transistors 162-2 or 162-3 is turned on, a LOW logic level is provided to the gate of N-channel MOS transistor 160 and the gate of either N-channel MOS transistor 162-6 or 162-7 to prevent current from flowing through the differential N-channel MOS transistor pair 156 and 158. The logic levels latched at nodes LEFT and RIGHT correspond to the up and down outputs, respectively from positive comparator 80.

The LEFT and RIGHT nodes are connected to output module 86. The output of the LEFT node is fed into a NOR gate 170 in output module 86. The NOR gate 170 comprises N-channel MOS transistors 170-1 and 170-2 and P-channel MOS transistors 170-3 and 170-4. Also being fed into NOR gate 170 is the output of the UPX node from the negative comparator 82 shown in FIG. 6A. The output of the RIGHT node is fed into a NOR gate 172 in output module 86. The NOR gate 172 comprises N-channel MOS transistors 172-1 and 172-2 and P-channel MOS transistors 172-3 and 172-4. Also being fed into NOR gate 172 is the output of the DOWNX node from the negative comparator 82 shown in FIG. 6A. To avoid overcomplicating the disclosure, the operation of NOR gates 170 and 172, well known to those of ordinary skill in the art, will not be described herein.

The output of NOR gate 170, illustrated as node UPB, is connected to a first input of a two-input NAND gate 174, and the output of NOR gate 172, illustrated as node DOWNB, is connected to a first input of a second NAND gate 176. First and second two-input NAND gates 174 and 176 are cross coupled to form a latch as is well known in the art. The output of NAND gate 174 forms a DOWN signal, and the output of NAND gate 176 forms an UP signal. In the two-phase embodiment the UP and DOWN signals are fed back to P-channel MOS transistor 54 and N-channel MOS transistor 56 through inverter 50, respectively as illustrated in FIG. 6A. In the three-phase embodiment the UP and DOWN signals are fed back to the NAND gate 48 and AND 52, respectively, as illustrated in FIG. 3. Accordingly, in comparing the two-phase and three phase embodiments, it should be recognized that the NAND gate 48 and AND gate 52 are omitted in the two-phase embodiment. In both the two-phase and three-phase embodiments, the UP and DOWN signals are fed to up/down counter 64.

In FIG. 6A, the integrator 38 comprising N-channel and P-channel MOS pass transistors 60-1 and 60-2 and second capacitor 62 is shown. The pass transistor 60 of FIG. 3 is depicted as the pair of N-channel and P-channel MOS pass transistors 60-1 and 60-2. The pair N-channel and P-channel MOS pass transistors 60-1 and 60-2 are employed instead of the single N-channel MOS pass transistor 60 because the P-channel MOS transistor 60-2 switches high voltage signals better than N-channel MOS transistor 60. In the two-phase embodiment, the tracking voltage and analog input voltage are compared during the first phase, and first capacitor 58 is either charged or discharged. In the second phase charge is transferred between first capacitor 58 and second capacitor 62, and the up/down counter 64 and up counter 66 are enabled.

As pointed out above, it is sometimes desirable to sample and hold the analog input voltage for use through out the entire conversion cycle. However, an error can be introduced to the up/down count when the analog input voltage has changed from the previous sample. To avoid the error which may be introduced into the up/down count by this method as the tracking voltage moves up or down to find the analog input voltage, a shorting circuit 124 shorts the tracking voltage to the analog input voltage together at the beginning of each conversion cycle.

In shorting circuit 124, the analog input voltage is connected to the source and drain, respectively, of a first pair of N-channel and P-channel MOS transistors 124-1 and 124-2. The drain and source, respectively, of N-channel and P-channel MOS transistors 124-1 and 124-2 are connected to the tracking voltage. The gate of N-channel MOS transistors 124-1 is connected to the XFER signal, and the gate of P-channel MOS transistors 124-2 is connected to the complement of the XFER signal (XFERB). When the XFER signal is applied to the gate of N-channel MOS transistor 124-1, and the XFERB signal is applied to the gate of P-channel MOS transistor 124-2 the tracking voltage is set to the analog input voltage.

Figure 7:
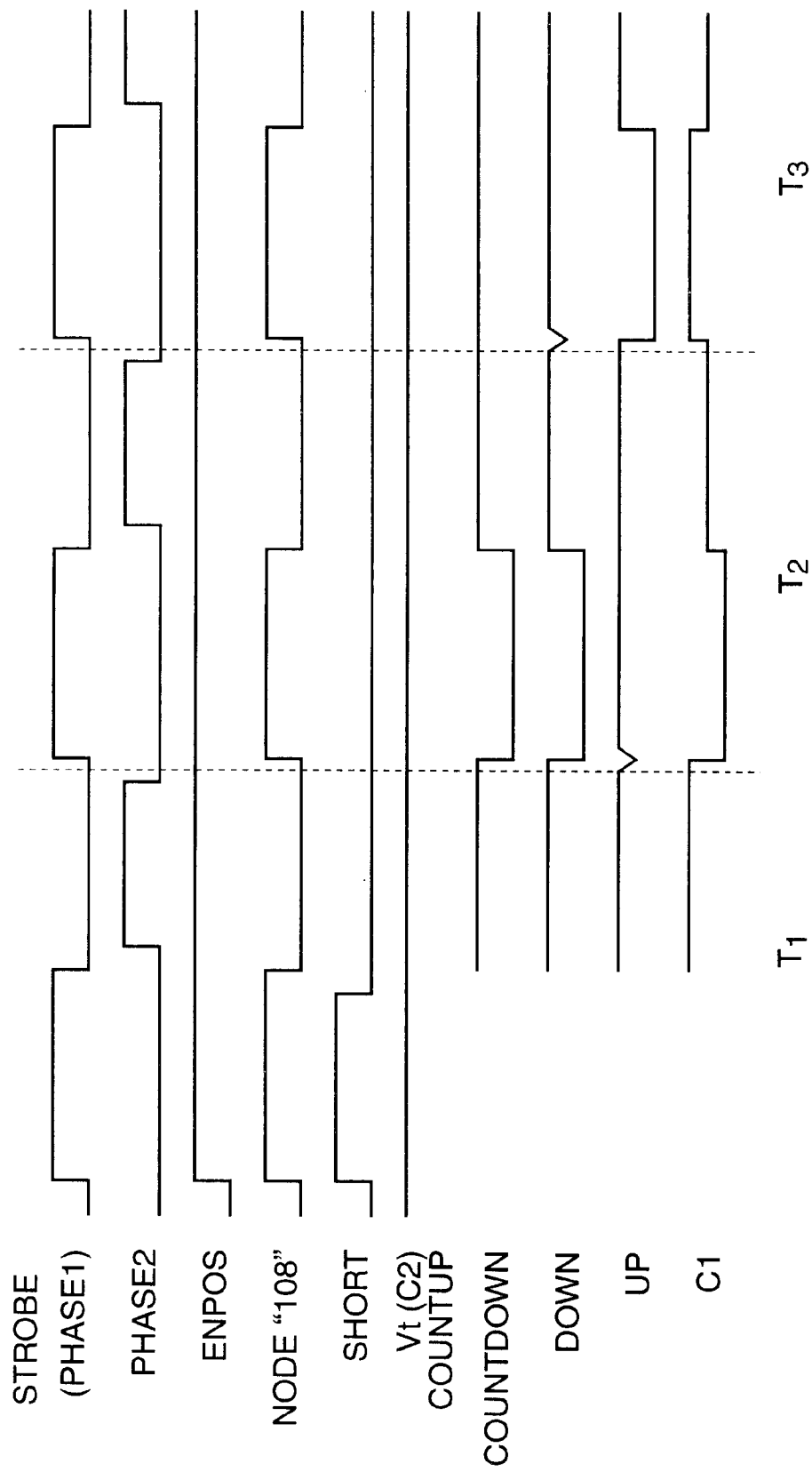
FIG. 7 is a timing diagram of the two phase operation of the positive comparator of FIG. 5.

The two-phase operation of the negative comparator 80 in the modified delta-sigma modulator 32 can be observed by reference to the timing diagram illustrated in FIG. 7. The timing diagram is shown at the beginning of a conversion cycle. Each of the comparisons of $V_x$ and $V_t$ in the conversion cycle are shown as periods T1, T2, T3, etc. Each period includes both a first phase and a second phase.

At the beginning of the conversion cycle, in the period T1, the negative comparator 80 is enabled with the phase1 (strobe) and ENNEG signals. Since a sample and hold circuit is used, the XFER signal also goes high, and $V_t$ (TRACK) is set to $V_x$ (not shown). Prior to the beginning of T2, with the ENNEG still HIGH, the negative comparator 80 is not enabled, but current is steered into the differential P-channel MOS transistor pair 106 and 108 by P-channel MOS transistor 110 which is turned on by N-channel MOS transistor 112-1 whose gate is connected to the output 102 (senseENB) of NAND gate 100.

At the beginning of phase1 in T2, the differential P-channel MOS transistor pair 106 and 108 senses that $V_t$ is greater than $V_x$, a LOW logic level is latched onto the LEFTB node, and the DOWNB node goes LOW as well. The LOW logic level at the DOWNB node turns on N-channel MOS transistor 56, and causes first capacitor 58 (C1) to be discharged. The LOW logic on the LEFTB node also turns on P-channel MOS transistor 112-2, which turns off P-channel MOS transistor 110 to prevent current form being steered into the differential P-channel MOS transistor pair 106 and 108.

When the phase2 signal goes HIGH, the charge on the capacitors 58 and 62 (C1 and C2, respectively) is balanced, and because first capacitor 58 was discharged during phase1, $V_t$ represented by the voltage on capacitor C2 is lowered. It can also be noted that the voltage on first capacitor 58 (C1) is the same as $V_t$ during phase2.

During phase1 of T3, it is sensed that $V_t$ is now less than $V_x$. The RIGHTB node goes to a LOW logic level, and the UPB node follows it down. The LOW logic level on the UPB node turns on P-channel MOS transistor 54, and capacitor 58 (C1) is charged to Vdd. When the phase2 signal goes HIGH, the charge on the capacitors C1 and C2 is balanced, and as a result, $V_t$ goes up.

For each of the sample cycles represented by T1, T2, T3, etc., the UP and DOWN signals are counted in the UP/DOWN counter previously described. After the selected number of analog samples have been taken, the value in the UP/DOWN counter is a function of the average analog input signal for the conversion cycle period represented by the selected number of analog signal samples. By processing the analog input voltage many times during a conversion cycle, a high resolution conversion of the analog input voltage can be performed using the low resolution components described herein.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An analog-to-digital converter comprising:

a comparator having first and second inputs, and an output, said comparator comparing an analog input voltage at said first input to a tracking voltage at said second input to place a digital output on said comparator output in response thereto;

a voltage switching matrix having an input connected to said output of said comparator and an output;

an integrator having an input connected to said output of said voltage switching matrix and an output connected to said second input of said comparator to complete a feedback loop and to provide said tracking signal to said second input of said comparator; and a digital filter coupled to said output of said comparator, said digital filter to form a digital output corresponding to said analog input signal at said first input of said comparator.

2. The analog-to digital converter of claim 1, wherein said comparator comprises:

a positive comparator having a first input coupled to said analog input voltage, a second input coupled to said tracking voltage, an enable input coupled to a first select signal which enables said positive comparator when said analog input voltage is greater than a preset voltage level, a strobe input coupled to a strobe signal to turn on said positive comparator, and an output;

a negative comparator having a first input coupled to said analog input voltage, a second input coupled to said tracking voltage, an enable input coupled to a second select signal to enable said negative comparator when said analog input voltage is less than a preset input voltage level, a strobe input coupled to said strobe signal to turn on said negative comparator, and an output; and an output module having a first input connected to said output of said positive comparator and a second input connected to said output of said negative comparator, and first and second outputs to provide said comparator output to said voltage switching matrix and to said digital filter.

3. The analog-to digital converter of claim 2, wherein said output module comprises:

first and second NOR gates having first and second inputs and an output, said first input of said first NOR gate connected to a first output of said positive comparator, said second input of said first NOR gate connected to a first output of said negative comparator, said first input of said second NOR gate connected to a second output of said positive comparator, and said second input of said second NOR gate connected to a second output of said negative comparator, first and second NAND gates having first and second inputs and an output, said first input of said first NAND gate connected to said output of said first NOR gate, said second input of said first NAND gate connected to said output of said second NAND gate, said first input of said second NAND gate connected to said output of said second NOR gate, and said second input of said first NAND gate connected to said output of said first NAND gate.

4. The analog-to digital converter of claim 1, wherein said digital filter comprises:

an up/down counter having an input coupled to said output of said comparator, an enable input, a reset input, and an output;

an up counter having an enable/count input, and an overflow output coupled to a reset input; said overflow output coupled to said reset input of said up/down counter; and a register having a data input connected to said output of said up/down counter, and an enable input connected to said overflow output of said up counter.

5. The analog-to-digital converter of claim 1, further including a preamplifier having an input connected to said analog input voltage, and an output connected to said first comparator input, said preamplifier to provide gain to said analog input voltage to normalize said analog input signal to be in a range of about one-half to all of a rail-to-rail potential of said comparator.

6. An analog-to-digital converter comprising:

a comparator having first and second inputs, and an output, said comparator comparing an analog input voltage at said first input to a tracking voltage at said second input to place a digital output on said comparator output in response thereto;

a first capacitor having a first electrode connected to a first reference voltage and having a second electrode coupled to said first reference voltage in response to a first digital output level from said comparator and coupled to a second reference voltage in response to a second digital output level from said comparator;

a second capacitor having a first electrode connected to said first reference voltage and a second electrode coupled to said second electrode of said first capacitor by at least one switching device and connected to said second input of said comparator, said second capacitor having a capacitance greater than a capacitance of said first capacitor, and said second capacitor storing said tracking voltage for comparison to said analog input voltage by said comparator; and a digital filter coupled to said output of said amplifier, said digital filter to form a digital output corresponding to said analog input voltage at said first input of said comparator.

7. The analog-to digital converter of claim 6, wherein said comparator comprises:

a positive comparator having a first input coupled to said analog input voltage, a second input coupled to said tracking voltage, an enable input coupled to a first select signal which enables said positive comparator when said analog input signal is greater than a preset voltage level, a strobe input coupled to a strobe signal to turn on said positive comparator, and an output;

a negative comparator having a first input coupled to said analog input voltage, a second input coupled to said tracking voltage, an enable input coupled to a second select signal to enable said negative comparator when said analog input voltage is less than a preset input voltage level, a strobe input coupled to said strobe signal to turn on said negative comparator, and an output; and an output module having a first input connected to said output of said positive comparator and a second input connected to said output of said negative comparator, and first and second outputs to provide said first and second digital output levels from said comparator and said digital filter.

8. The analog-to digital converter of claim 7, wherein said output module comprises:

first and second NOR gates having first and second inputs and an output, said first input of said first NOR gate connected to a first output of said positive comparator, said second input of said first NOR gate connected to a first output of said negative comparator, said first input of said second NOR gate connected to a second output of said positive comparator, and said second input of said second NOR gate connected to a second output of said negative comparator, first and second NAND gates having first and second inputs and an output, said first input of said first NAND gate connected to said output of said first NOR gate, said second input of said first NAND gate connected to said output of said second NAND gate, said first input of said second NAND gate connected to said output of said second NOR gate, and said second input of said first NAND gate connected to said output of said first NAND gate.

9. The analog-to digital converter of claim 6, wherein said digital filter comprises:

an up/down counter having an input coupled to said output of said comparator, an enable input, a reset input, and an output;

an up counter having an enable/count input, and an overflow output coupled to a reset input; said overflow output coupled to said reset input of said up/down counter; and a register having a data input connected to said output of said up/down counter, and an enable input connected to said overflow output of said up counter.

10. The analog-to-digital converter of claim 6, further including a preamplifier having an input connected to said analog input voltage, and an output connected to said first comparator input, said preamplifier providing gain to said analog input signal to normalize said analog input voltage to be in a range of about one-half to all of a rail-to-rail potential of said comparator.

11. The analog-to digital converter of claim 6, wherein said capacitance of said second capacitor has a ratio to said capacitance of said first capacitor in a range of about two-to-one to about one hundred and twenty-eight-to-one.

12. The analog-to digital converter of claim 6, wherein said capacitance of said second capacitor has a ratio to said capacitance of said first capacitor of about sixty-four-to-one.

13. A method for performing an analog-to-digital conversion comprising the steps of:

1) comparing an analog input voltage to a tracking voltage to generate a digital up voltage when said analog input voltage is greater than said tracking voltage or a digital down voltage when said analog input voltage is less than said tracking voltage;

2) incrementing an accumulator in response to said digital up voltage or decrementing said accumulator in response to said digital down voltage;

3) incrementing said tracking voltage in response to said digital up voltage or decrementing said tracking voltage in response to said digital down voltage;

4) repeating steps 1 through 3 a predetermined number of times; and next 5) outputting a digital value from said accumulator, said digital value in said accumulator being related to the digital conversion value of an average of said analog input signals.

14. The method for performing an analog-to-digital conversion of claim 13, wherein step 3 comprises the substeps of:

charging a first capacitor to Vdd in response to said digital up voltage or discharging said first capacitor to ground in response to said digital down voltage, sharing charge on said first capacitor with charge forming said tracking voltage on a second capacitor to increment or decrement said tracking voltage, said second capacitor having a capacitance greater than a capacitance of said first capacitor.

15. The method for performing an analog-to-digital conversion of claim 14, wherein said capacitance of said second capacitor has a ratio to said capacitance of said first capacitor in a range of about two-to-one to about one hundred and twenty-eight-to-one.

16. The method for performing an analog-to-digital conversion of claim 14, wherein said capacitance of said second capacitor has a ratio to said capacitance of said first capacitor of about sixty-four-to-one.

17. A method for performing an analog-to-digital conversion comprising the steps of:

1) comparing an analog input voltage to a predetermined voltage;

2) enabling a first comparator when said analog input voltage is greater than said predetermined voltage to compare said analog input voltage to a tracking voltage and generate a digital up voltage when said analog input voltage is greater than said tracking voltage or a digital down voltage when said analog input voltage is less than said tracking voltage;

3) enabling a second comparator when said analog input voltage is less than said predetermined voltage to compare said analog input voltage to a tracking voltage and generate said digital up voltage when said analog input voltage is greater than said tracking voltage or said digital down voltage when said analog input voltage is less than said tracking voltage;

4) incrementing an accumulator in response to said digital up voltage or decrementing said accumulator in response to said digital down voltage;

5) incrementing said tracking voltage in response to said digital up voltage or decrementing said tracking voltage in response to said digital down voltage;

6) repeating steps 1 through 5 a predetermined number of times; and next 7) outputting a digital value from said accumulator, said digital value in said accumulator being related to the digital conversion value of an average of said analog input signals.

18. The method for performing an analog-to-digital conversion of claim 17, wherein step 5 comprises the substeps of:

charging a first capacitor to Vdd in response to said digital up voltage or discharging said first capacitor to ground in response to said digital down voltage, sharing charge on said first capacitor with charge forming said tracking voltage on a second capacitor to increment or decrement said tracking voltage, said second capacitor having a capacitance greater than a capacitance of said first capacitor.

19. The method for performing an analog-to-digital conversion of claim 18, wherein said capacitance of said second capacitor has a ratio to said capacitance of said first capacitor in a range of about two-to-one to about one hundred and twenty-eight-to-one.

20. The method for performing an analog-to-digital conversion of claim 18, wherein said capacitance of said second capacitor has a ratio to said capacitance of said first capacitor of about sixty-four-to-one.

* * * * *

UNITED STATES PATENT AND TRADEMARK OFFICE
CERTIFICATE OF CORRECTION

PATENT NO. : 5,907,299
DATED : May 25, 1999
INVENTOR(S) : Robert S. Green and Keith L. Davis It is certified that error appears in the above-identified patent and that said Letters Patent is hereby corrected as shown below:

On column 10, line 49, please replace "1 10" with --110--.

Signed and Sealed this

Fourteenth Day of December, 1999

Attest:

Attesting Officer

Q. TODD DICKINSON

Acting Commissioner of Patents and Trademarks